(12) United States Patent
Thomsen et al.

(10) Patent No.: US 9,099,994 B2
(45) Date of Patent: Aug. 4, 2015

(54) RELAXATION OSCILLATOR

(71) Applicants:Axel Thomsen, Austin, TX (US); Pavel Konecny, San Jose, CA (US); Xiaodong Wang, Austin, TX (US)

(72) Inventors: Axel Thomsen, Austin, TX (US); Pavel Konecny, San Jose, CA (US); Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 317 days.

(21) Appl. No.: 13/721,885

(22) Filed: Dec. 20, 2012

(65) Prior Publication Data

US 2014/0176250 A1 Jun. 26, 2014

(51) Int. Cl.
*H03K 3/011* (2006.01)
*H03K 3/0231* (2006.01)

(52) U.S. Cl.
CPC .................................. *H03K 3/0231* (2013.01)

(58) Field of Classification Search
CPC ........................................................ H03K 3/011
USPC .......................................... 331/111, 143, 153
See application file for complete search history.

(56) References Cited

U.S. PATENT DOCUMENTS

| 7,847,648 | B2* | 12/2010 | Hu et al. | 331/143 |
| 2007/0188247 | A1* | 8/2007 | Westra | 331/36 C |
| 2010/0164638 | A1* | 7/2010 | Saw | 331/111 |
| 2012/0313720 | A1* | 12/2012 | Feldtkeller | 331/143 |

OTHER PUBLICATIONS

Silicon Labs, "C8051F500, 50 MIPS, 64 kB Flash, 12-Bit ADC, 48-Pin Automotive MCU," Nov. 20, 2008, 1 page.
Wikipedia, "CAN bus," http://en.wikipedia.org/wiki/CAN_bus, 14 pages, Date: Dec. 19, 2012.
Wikipedia, "Relaxation Oscillator," http://en.wikipedia.org/wiki/Relaxation_oscillator, 6 pages, Date: Dec. 19, 2012.
U.S. Appl. No. 13/362,450, filed Jan. 31, 2012, entitled "Performing Digital Windowing in an Analog-to-Digital Converter (ADC)," by Douglas S. Piasecki.

\* cited by examiner

*Primary Examiner* — Joseph Chang
*Assistant Examiner* — Jeffrey Shin
(74) *Attorney, Agent, or Firm* — Trop, Pruner & Hu, P.C.

(57) ABSTRACT

In an embodiment, a method includes: during a first portion of a cycle of a clock signal generated by an oscillator, precharging a first capacitor of a first switched capacitor stage until a first comparator determines that a first node voltage of the first switched capacitor stage is greater than a first reference voltage at a first reference voltage node; applying a second reference voltage to the first reference voltage node; and responsive to a first edge of the clock signal, charging the first capacitor until the first comparator determines that the first node voltage is greater than the second reference voltage at the first reference voltage node.

20 Claims, 7 Drawing Sheets

RELAXATION OSCILLATOR

BACKGROUND

Many electronic devices operate using one or more clocks. These clocks are often generated using an oscillator. Many different oscillator types exist and can be implemented in different systems. Typical integrated circuits (ICs) often include one or more on-chip oscillators to develop clock signals. Some such oscillators are formed using resistors and capacitors (so-called RC circuits) that are selected to generate a desired clock frequency. For most systems a stable clock frequency is a requisite for proper operation.

One issue affecting output frequency stability over temperature with existing comparator-based relaxation oscillators is that comparator and logic delay is temperature dependent. The temperature coefficient itself varies from part-to-part mainly due to random variations of transistor threshold voltage ($V_T$) and transistor beta. As a result, the random variations temperature coefficient of each IC is factory trimmed at multiple temperature points, which is extremely costly. Another issue in using a comparator-based oscillator is that comparator and logic delay is supply dependent.

SUMMARY OF THE INVENTION

According to one aspect, an apparatus includes: a first capacitor to pre-charge to a first voltage exceeding a first reference voltage by a first delay compensation voltage during a first portion of a clock period and thereafter to charge to a second voltage exceeding a second reference voltage by a second delay compensation voltage during a second portion of the clock period; a second capacitor to charge to the second voltage during the first portion of the clock period and to pre-charge to the first voltage during the second portion of a clock period; a first comparator coupled to the first capacitor to compare a first voltage of the first capacitor to the first reference voltage during the first clock period portion and to compare the first capacitor voltage to the second reference voltage during the second clock period portion and to provide a first comparison output to a timing logic; a second comparator coupled to the second capacitor to compare a voltage of the second capacitor to the second reference voltage during the first clock period portion and to compare the second capacitor voltage to the first reference voltage during the second clock period portion and to provide a second comparison output to the timing logic; and the timing logic to receive the first comparison output and the second comparison output and to generate a clock signal based thereon.

The apparatus may further include a reference voltage generation circuit to generate the first and second reference voltages. This circuit may include a first switch to couple the first reference voltage to a comparison input of the first comparator during the first portion of the clock period and to couple the second reference voltage to the comparison input of the first comparator during the second portion of the clock period. In an embodiment, the reference voltage generation circuit includes a first branch including a first resistor to generate the first reference voltage, and a second branch including a temperature compensation trimmed resistor to generate the second reference voltage.

In an embodiment, the timing logic includes a latch to receive the first and second comparison outputs and to generate the clock signal therefrom. The timing logic also includes a control logic to generate first and second control signals to control a first and second plurality of switches of respective switched capacitor stages including the first and second capacitors.

In an embodiment, the first switched capacitor stage includes a first switch coupled between a first current source and a reference voltage node, a second switch coupled between the first current source and the first capacitor, and a third switch coupled in parallel with the first capacitor between the first current source and the reference voltage node. A first capacitor voltage node is coupled to the first capacitor and the third switch to provide the first capacitor voltage to the first comparator.

In an embodiment, the control logic includes a state machine to control the first plurality of switches to enable the pre-charge of the first capacitor, the charge of the first capacitor, and a discharge of the first capacitor. Note that the first capacitor is to control a timekeeping operation for the clock signal during the second clock period portion, and the second capacitor is to control the timekeeping operation for the clock signal during the first portion of the clock period.

In another aspect, a system includes an oscillator to generate a first clock signal. The oscillator includes: a first switched capacitor stage to control a timekeeping operation for the first clock signal during a second portion of a cycle of the first clock signal and includes a first capacitor; a second switched capacitor stage to control the timekeeping operation for the first clock signal during a first portion of the cycle, and includes a second capacitor; and a control logic to generate first control signals to control the first switched capacitor stage to cause the first capacitor to pre-charge to a first voltage greater than a first reference voltage, to charge to a second voltage greater than a second reference voltage, and to thereafter discharge, the control logic further to generate second control signals to control the second switched capacitor stage to charge the second capacitor to the second voltage, to discharge, and to thereafter pre-charge to the first voltage, where the control logic is to generate the first clock signal based on an output of the first and second switched capacitor stages. A microcontroller may be coupled to the oscillator to operate using the first clock signal.

In an embodiment, a first phase locked loop is coupled to receive the first clock signal and to control a second oscillator to generate a second clock signal, where the second clock signal is a system clock signal for the microcontroller. A second phase locked loop is to receive the first clock signal and to control a second oscillator to generate a third clock signal, where the third clock signal is a reference clock signal for an interconnect. The microcontroller is to communicate with at least one other device via the interconnect clocked by the third clock signal.

A still further aspect is directed to a method including: during a first portion of a cycle of a clock signal generated by an oscillator, pre-charging a first capacitor of a first switched capacitor stage until a first comparator determines that a first node voltage of the first switched capacitor stage is greater than a first reference voltage at a first reference voltage node; switching a second reference voltage to the first reference voltage node; and responsive to a first edge of the clock signal, charging the first capacitor until the first comparator determines that the first node voltage is greater than the second reference voltage at the first reference voltage node, where the first capacitor performs a timekeeping operation for a second portion of the clock cycle.

DETAILED DESCRIPTION

In various embodiments, an oscillator to generate a clock signal of a given frequency may be provided with a design enabling temperature and supply independence (or at least substantial independence) such that the generated clock frequency is stable over a wide range of operating temperatures. To this end, embodiments provide a technique to remove various delays inherent in an oscillator from causing such variations. More specifically, embodiments provide a technique to essentially remove comparator and logic-based delays such that well-behaved components of the circuit such as a resistors and capacitors contribute to the timekeeping ability that is stable over wide operating ranges. Embodiments may thus remove or at least reduce low frequency noise of comparators and also low frequency power supply noise. Although particular implementations are described herein, understand that the techniques disclosed herein can be used in a wide variety of oscillator circuits, including RC-based relaxation oscillators in which comparator delay affects the oscillation period.

Figure 1:
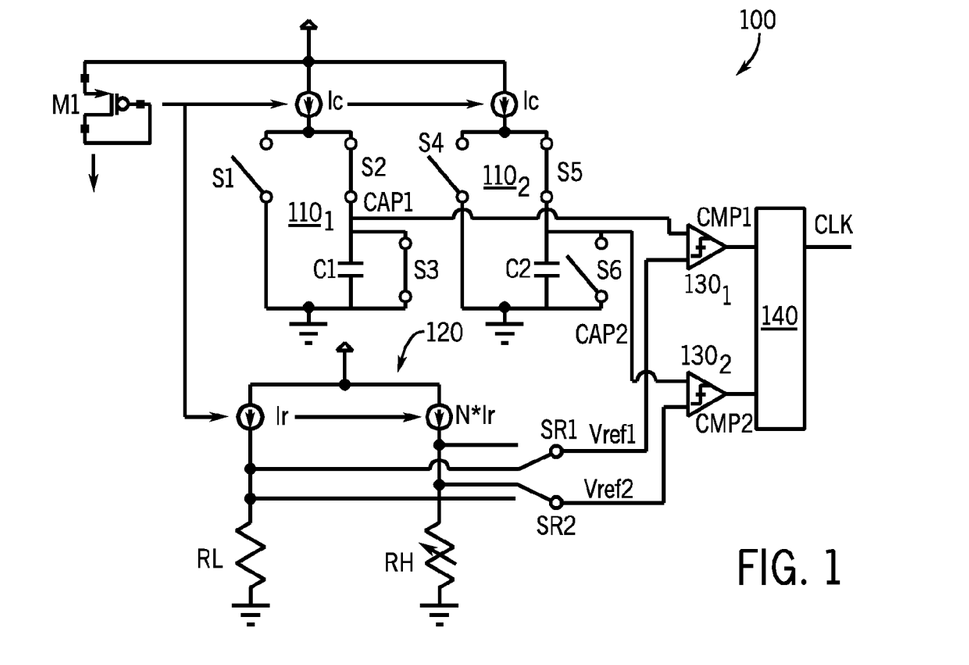
FIG. 1 is a schematic diagram of an oscillator in accordance with an embodiment.

Referring now to FIG. 1, shown is a schematic diagram of an oscillator 100 in accordance with an embodiment. As shown in FIG. 1, oscillator 100 may be used to generate a clock signal CLK that has relatively stable frequency performance over a wide range of variations in process, voltage, and temperature. In general, oscillator 100 may be configured as a relaxation oscillator that includes switched capacitor stages $110_1$ and $110_2$ (generally switched capacitor stages 110) each having a corresponding capacitor C1 and C2, respectively, which in an embodiment may be of equal values. As seen, each switched capacitor stage 110 is coupled between a current source $I_c$ and a reference voltage node (e.g., a ground node).

Based on control of a set of switches of the switched capacitor stage, the corresponding capacitor can be selectively charged and discharged to provide a voltage to a corresponding one of comparators $130_1$ and $130_2$ (generally comparator 130) for comparison to a reference voltage provided to these comparators. As will be described, these reference voltages can be switched between different levels during different portions of a clock cycle to thus generate comparator output signals CMP1 and CMP2, respectively that are provided to a control logic 140. In an embodiment control logic 140 includes a RS latch for receiving the comparator output signals and generating a clock signal therefrom. In addition control logic 140 includes a state machine logic to receive these comparator output signals and control switching of the various switches, both of switched capacitor stages $110_1$ and $110_2$ and a reference voltage circuit 120.

As shown in FIG. 1, a reference voltage generation circuit 120 is further present and used to provide these multiple reference voltage levels to comparators 130. In the embodiment shown, reference voltage generation circuit 120 includes a pair of current sources, namely a first current source $I_R$ and a second current source $NxI_R$, where N is an integer value. Thus different currents are generated in these current sources and are used to generate reference voltages via load resistors $R_L$ and $R_H$ respectively. In an embodiment, at least one of the resistors (e.g., $R_H$) may be a temperature compensation trimmed resistor having the lowest temperature compensation possible. Specifically, the left side of reference voltage generation circuit 120 generates a first reference voltage level at a first reference voltage node. This first reference voltage may correspond to a low reference voltage level of $V_{REF1}$, which in an embodiment may be approximately 0.15 volts. In turn the right side of reference voltage generation circuit 120 generates a second reference voltage level at a second reference voltage node. This second reference voltage may correspond to a high reference voltage level of $V_{REF2}$, which in an embodiment may be approximately 0.45 volts. Via control of switches $S_{R1}$ and $S_{R2}$, these reference voltage nodes are in turn coupled to the reference inputs of comparators 130. Note in another embodiment, reference voltage generation circuit 120 may be implemented as a single branch with series connected resistors and a single current source.

As further seen, circuit 100 receives a bandgap current signal or another current with arbitrary temperature coefficient via a metal oxide semiconductor field effect transistor (MOSFET) M1 having a source terminal coupled to receive this current signal and commonly coupled to a gate terminal of the MOSFET, and the drain terminal coupled to current sources $I_C$. Note that while shown with this high level view in FIG. 1, understand the scope of the disclosure is not limited in this regard and understand that an oscillator in accordance with an embodiment can take other forms in different implementations.

Operations of oscillator 100 will now be described as to FIGS. 1-4, which show selection of control switches at different periods of a clock cycle. At a beginning of a clock cycle, e.g., following the falling edge of a clock signal, the arrangement is as shown in FIG. 1, in which switches S2 and S3 of switched capacitor stage $110_1$ are closed and switch S1 is open. In this case, the voltage stored in capacitor C1 is discharged to approximately 0 volts. During this operation, the reference voltage provided to comparator $130_1$ is the low level reference voltage ($V_{REF1}$). At the same time, a high reference voltage ($V_{REF2}$) is provided to comparator $130_2$. Furthermore at this time, switch S5 of switched capacitor stage $110_2$ is closed such that capacitor C2 begins charging from a pre-charge state.

That is, as discussed below capacitor C2 is initially charged with a pre-charge voltage in that during a previous cycle, the low reference voltage was provided to comparator $130_2$ with switch S5 closed to thus charge capacitor C2, e.g., from an initial 0V value, to a pre-charge value of $V_{low\,2}$ corresponding to $V_{REF1}+T_{D2}\times I_C/C_2$, where $T_{D2}$ is a delay time corresponding to the delay within control logic 140 due to the delay in the comparator of detecting this threshold voltage crossing.

By enabling the pre-charge voltage to exceed this low reference voltage level, a measure of the delay associated with the comparator and control logic circuitry can be determined and translated into a voltage corresponding to the amount by which the pre-charge voltage exceeds the low reference voltage. This voltage difference is referred to herein as a delay compensation voltage. This same amount of delay compensation voltage is also seen when the capacitor is charged to a level above the high reference voltage level, during a timekeeping portion of a clock cycle (discussed below). Note that during this portion of the clock cycle (in which the clock signal is at a low value) and capacitor C2 is being charged to a high voltage level, it is this capacitor C2 that performs the timekeeping operation for this portion of the clock cycle.

Figure 2:
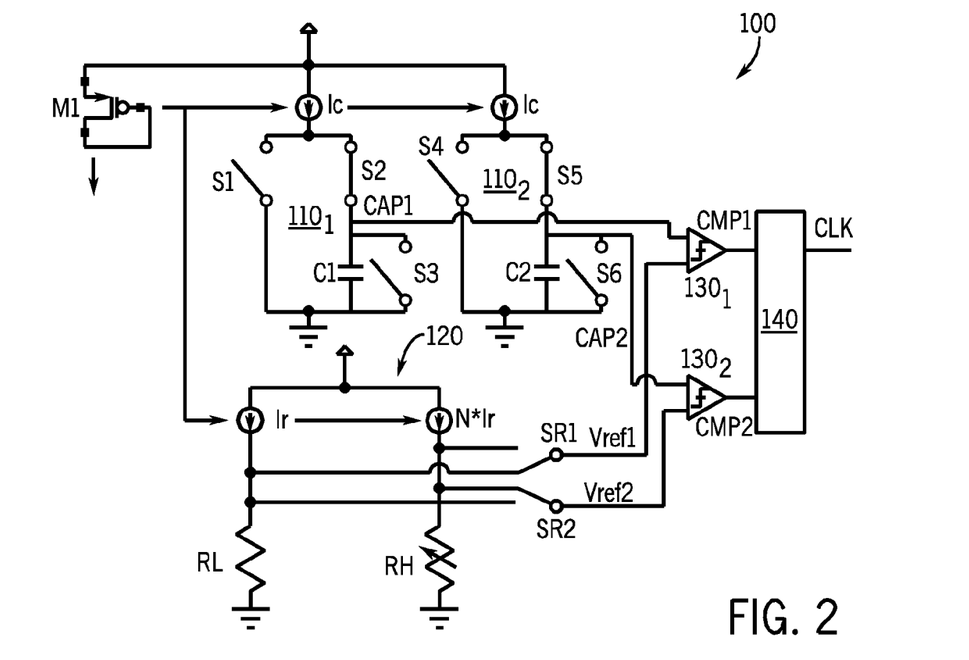
FIG. 2 is a schematic diagram of an oscillator during a further portion of a clock cycle.

Referring now to FIG. 2, shown is a schematic diagram of oscillator 100 during a further portion of a clock cycle. As seen in FIG. 2, circuit 100 is the same as in FIG. 1, however note the different arrangement of the switches such that with switch S3 open in switched capacitor stage 110₁ capacitor C1 begins charging to a pre-charge voltage, as discussed above. Also note that switched capacitor stage 110₂ remains the same as in FIG. 1 such that capacitor C2 continues charging until an output of comparator 130₂ indicates that the voltage of capacitor C2 reaches a level of the high reference voltage $V_{REF2}$.

Figure 3:
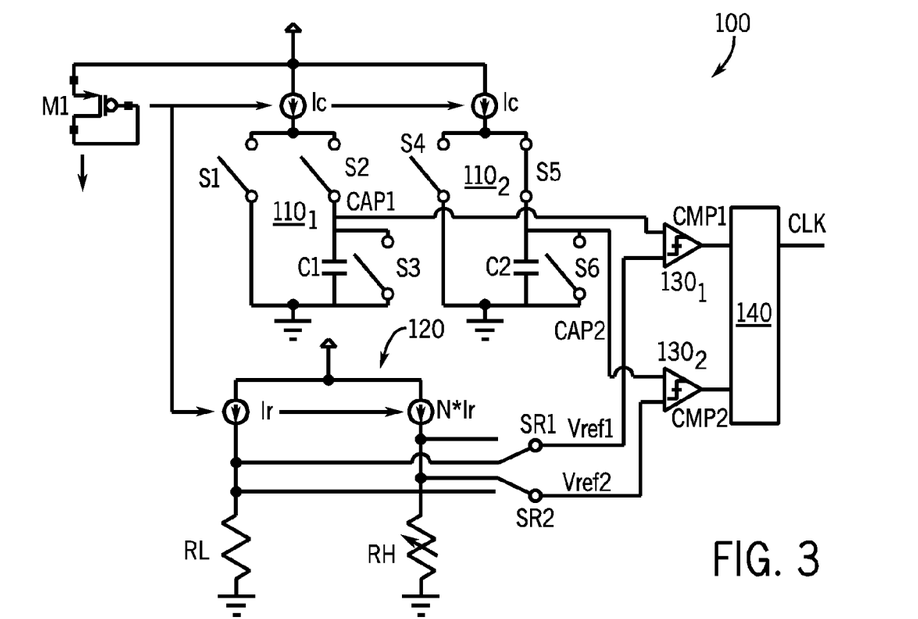
FIG. 3 is a schematic diagram of an oscillator during a still further portion of a clock cycle.

Referring now to FIG. 3, shown is a schematic diagram of oscillator 100 during a still further portion of a clock cycle. Here note that in switched capacitor stage 110₁ switch S2 is opened when the voltage at capacitor node CAP1 is detected to exceed the low reference voltage $V_{REF1}$, causing the output of comparator 130₁ to go high. Thus capacitor C1 is at a pre-charge voltage. Also note that capacitor C2 continues to charge from its pre-charge voltage.

Figure 4:
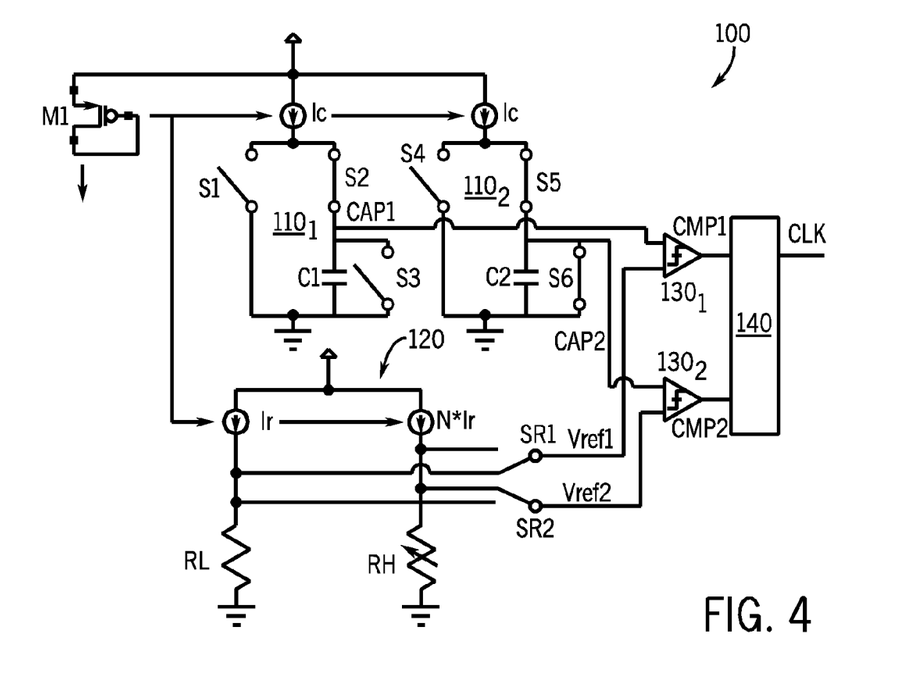
FIG. 4 is a schematic diagram of an oscillator during a yet further portion of a clock cycle.

Referring now to FIG. 4, shown is a schematic diagram of oscillator 100 during a yet further portion of a clock cycle. In this portion of the clock cycle, the voltage at the second capacitor node exceeds the high level reference voltage such that the output CMP2 of comparator 130₂ goes high such that this voltage at the second capacitor node corresponds to $V_{HIGH2}$ that equals $V_{REF2}+T_{d2} \times I_C/C_2$.

As a result of comparator 130₂ output changing to a high state, the reference voltages are switched between the respective comparators. And C2 begins discharging. Note here switch S2 is closed so that capacitor C1 begins charging from its pre-charge voltage. And thus for this portion of the clock cycle, it is first capacitor C1 that performs the timekeeping operation. Thus here the high reference voltage is coupled to comparator 130₁, in that after the output of comparator 130₂ goes high, this comparator is provided with the low reference voltage input. And with switch S6 closed, capacitor C2 discharged, e.g., to approximately zero volts. The operations described as to the switching of the control switches in FIGS. 1-4 generally proceeds in like manner for each clock cycle of the clock signal generated responsive to the two comparator outputs of oscillator 100.

Figure 5:
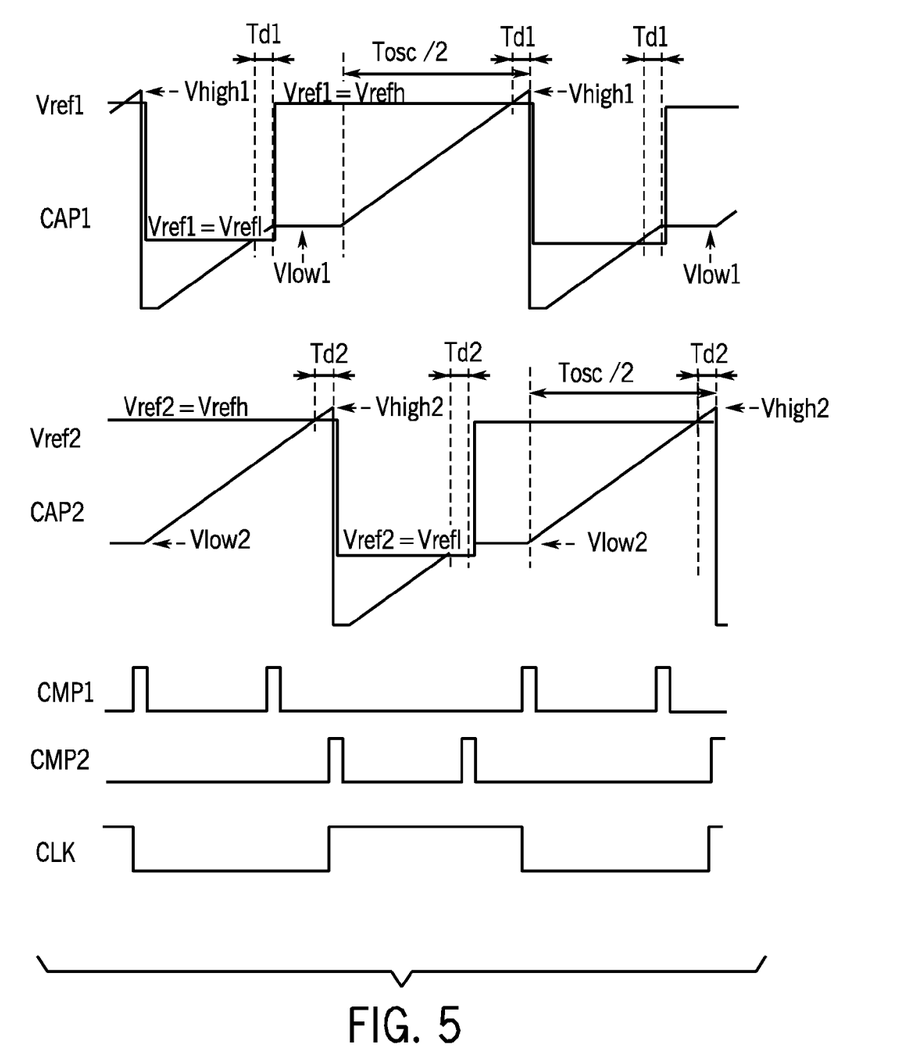
FIG. 5 is a timing diagram illustrating the operation of an oscillator.

Referring now to FIG. 5, shown is a timing diagram of the oscillator of FIG. 1, illustrating the voltages present at the reference voltage nodes provided to comparators 130₁ and 130₂ ($V_{REF1}$ and $V_{REF2}$, respectively) and the corresponding capacitor voltage node values (CAP1 and CAP2), along with the logic outputs of the comparators and the resulting clock signal. As seen, capacitors C1 and C2 are pre-charged to a pre-charge voltage level ($V_{Low1}$ and $V_{Low2}$) which is a voltage value slightly higher than the low reference voltage level, due to the time delay resulting from the comparator and latch circuitry, and thus causing a slightly higher voltage than the low reference voltage level to be stored on the capacitors as a pre-charge voltage. Accordingly, when the capacitors are charged from this pre-charge state to the fully charged state on the high side when the capacitor voltage node voltages exceed the high level reference voltage, a known and fixed delay corresponding to the same time delay for the detection and switching to occur on the low side occurs. As such, embodiments remove the delay caused with by comparator and logic delay in each clock cycle so that the resulting clock signal has a frequency that is independent of comparator and logic delay.

As described, a state machine is implemented in control logic 140 to effect the control of the switches of oscillator 100. In an embodiment, the state machine is a 6-state state machine to operate as follows. In state 1, capacitor C2 voltage is held constant at a pre-charge voltage with S4 closed, and S5 and S6 open. Capacitor C1 is charged up by current source $I_C$. Comparator 130 receives the reference voltage of $V_{refh}$ with switches S1 and S3 open and S2 closed. Once the voltage at node CAP1 crosses the level of $V_{refh}$, comparator 130ₐ output goes from low to high and consequently the clock signal changes polarity.

In state 2, the reference voltage provided to comparator 130₁ is lowered to Vreflow and at the same time capacitor C1 is now discharged below level $V_{refl}$, with S1 open, and S2 and S3 closed. At the same time capacitor C2 starts to charge up from the pre-charge voltage, with switches S4 and S6 open, and S5 closed.

In state 3, after some time (sufficient enough to discharge C1 below $V_{refl}$), capacitor C1 starts to charge to a pre-charge voltage with switches S1 and S3 open, and S2 closed. Once the voltage at node CAP1 crosses level $V_{refl}$, comparator 130₁ output goes from low to high and capacitor C1 pre-charging is stopped. And with switches S2 and S3 open, and S1 closed, the voltage at node CAP1 is held constant.

In state 4, in the meantime comparator C2 is still being charged up and once the voltage at node CAP2 crosses the high reference voltage level $V_{refh}$, comparator 130₂ output goes from low to high and consequently, the clock signal changes polarity.

In state 5, now this reference voltage provided to comparator 130₂ is lowered to $V_{refl}$ and at the same time capacitor C2 is discharged below level $V_{ref2}$, with switches S4 open, and S5 and S6 closed. At the same time capacitor C1 begins to charge to the high reference voltage, with switches S1 and S3 open, and S2 closed.

In state 6, after some time (sufficient enough to discharge C2 below $V_{refl}$), capacitor C2 starts to charge to the pre-charge voltage, with switches S4 and S6 open, and S5 closed. Once the voltage at node CAP2 crosses the level of $V_{refl}$, comparator 130₂ output goes from low to high and charging is stopped with switches S5 and S6 open, and S4 closed, so that the voltage at node CAP2 is held constant at this pre-charge voltage.

The state-machine now loops back to state 1.

As seen below in the equations for a clock period Tosc, the comparator and logic delay fall out of the equation, which is purely dependent only on resistor R, capacitor C and temperature independent constants.

If $C1=C2=C$, Tosc=$2*C*(V_{refhigh}+T_{d1}*I_c/C-V_{reflow}-T_{d1}*I_c/C)/I_c$

Tosc=$2*C*(V_{refhigh}-V_{reflow})/Ic=2*C*(I_{ref}*RH)/I_c$

Substitute: $I_c k1*1_{vbgr}$, $I_{ref}=k2*I_{vbgr}$

Tosc=$2*C*k2*I_{vbgr}*RH/(k1*I_{vbgr})$

Tosc1=$2*C*RH*k2/k1$, where $k2, k1$ are temperature independent constants and $I_{vbgr}$ is an input band-gap current.

Thus the resulting clock frequency is not dependent on comparator and RS latch delays, and instead is dependent on the well-behaved RC values.

Figure 6:
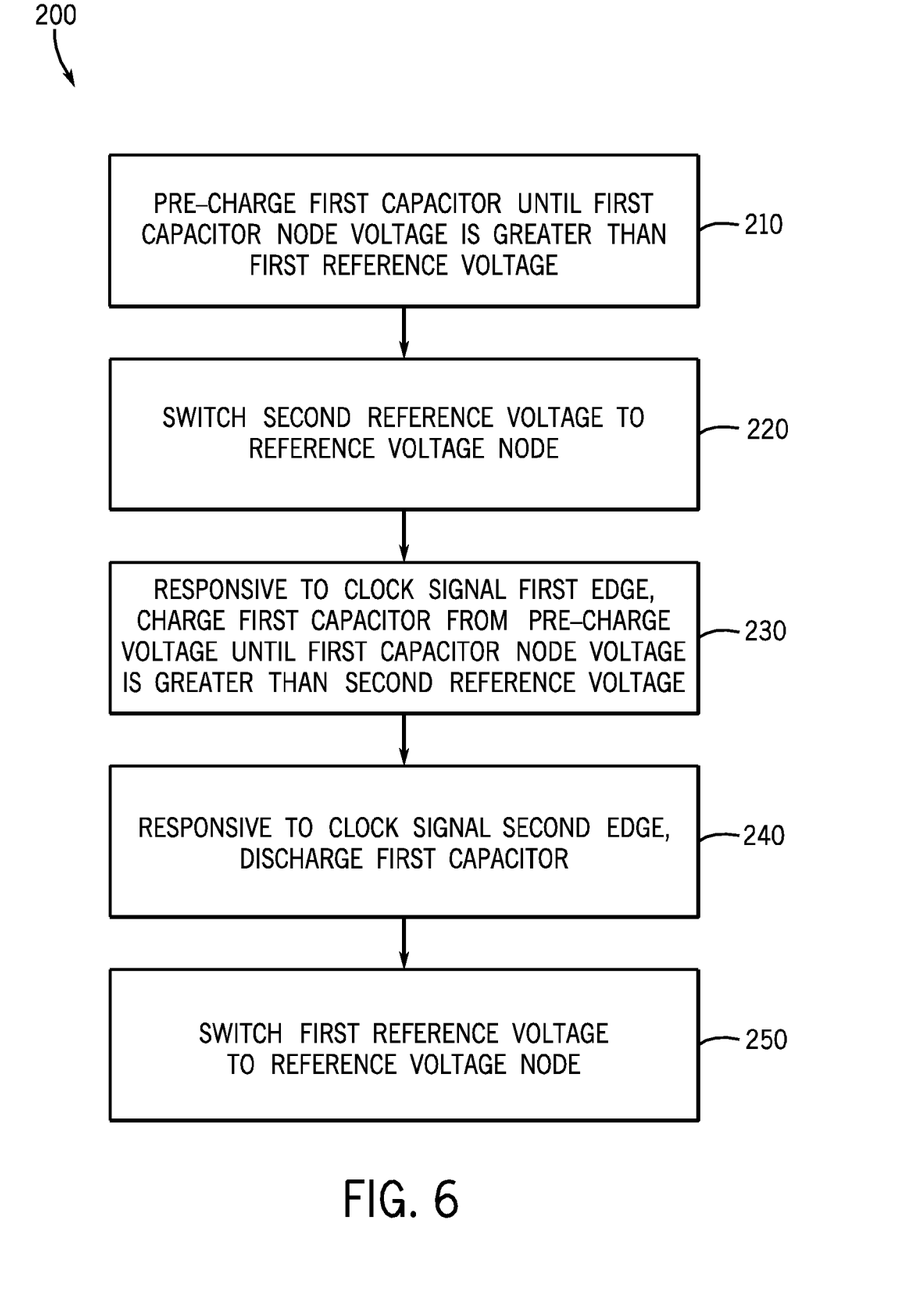
FIG. 6 is a flow diagram of a method for controlling an oscillator in accordance with an embodiment.

Referring now to FIG. 6, shown is a flow diagram of a method for controlling an oscillator in accordance with an embodiment. As shown in FIG. 6, method 200 may be implemented in a state machine or other control logic of the oscillator to cause appropriate switching of the switches of the oscillator to enable the operation described herein. As seen, method 200 begins by pre-charging a first capacitor until a first capacitor node voltage is greater than a first reference voltage (block 210). More specifically, this pre-charge operation charges the first capacitor to a level slightly higher than a low reference voltage that acts as the first reference voltage. This slightly higher level is due to the delay in comparator detection of the reference voltage crossing and control logic delay before switching is effected that thus stops the pre-charging from occurring. Note that this comparison of capacitor node voltage and reference voltage may be at a first comparator of the oscillator.

Next, control passes to block 220 where a second reference voltage (namely a high reference voltage level) can be switched to a reference voltage node coupled to the first comparator. This switching of the reference voltage level thus causes a change in the comparator output, in that the capacitor voltage level is not higher than the second reference voltage.

Still referring to FIG. 6, next control passes to block 230 where the first capacitor can be charged from the pre-charge voltage until the first capacitor node voltage is greater than the second reference voltage. Note that this charging of the first capacitor can be effected by appropriate selection of switches of the switched capacitor stage. Also note that this charging may begin responsive to a first edge of the clock signal, e.g., a rising edge of the clock signal. Note that this charging interval thus corresponds to a portion of the clock cycle in which this capacitor is responsible for timekeeping operations.

When it is determined by the comparator that the first capacitor node voltage exceeds the second reference voltage level (and where the first capacitor node voltage is at a delay compensation voltage above this reference level), appropriate switching may be effected to cause the first capacitor to be discharged. This discharge operation may be responsive to a second edge of the clock signal, namely a falling edge, which thus occurs responsive to the comparator detection of the capacitor node voltage exceeding the second reference voltage. Still referring to FIG. 6, control passes finally to block 250 where the reference voltage node can be switched back to the first reference voltage.

Note that the operations described in FIG. 6 is with regard to a single switched capacitor stage, and understand that the same operations can be used to pre-charge, charge and discharge a second capacitor of a second switched capacitor stage. Also, note that the operations performed for the second switched capacitor stage may be done out of phase with the operations for the first switched capacitor stage to thus realize a clock signal having a cycle in which timekeeping operations are controlled by the first switched capacitor stage for a second portion of the clock cycle and the timekeeping operations are controlled by the second switched capacitor stage for a first portion of the clock cycle. Although shown at this high level in the embodiment of FIG. 6, understand the scope is not limited in this regard.

As described above, because delays inherent in the comparator and logic circuitry are removed, the components that set the timekeeping operations for the oscillator are the resistor and capacitor. As for the capacitor, there is no temperature dependence. And for a resistor, a simple one point calibration can be performed to resolve the temperature dependency of the resistor. Different manners of providing a temperature coefficient for the resistor can be realized. As an example, different resistors can be provided to enable temperature dependent operation.

Figure 7:
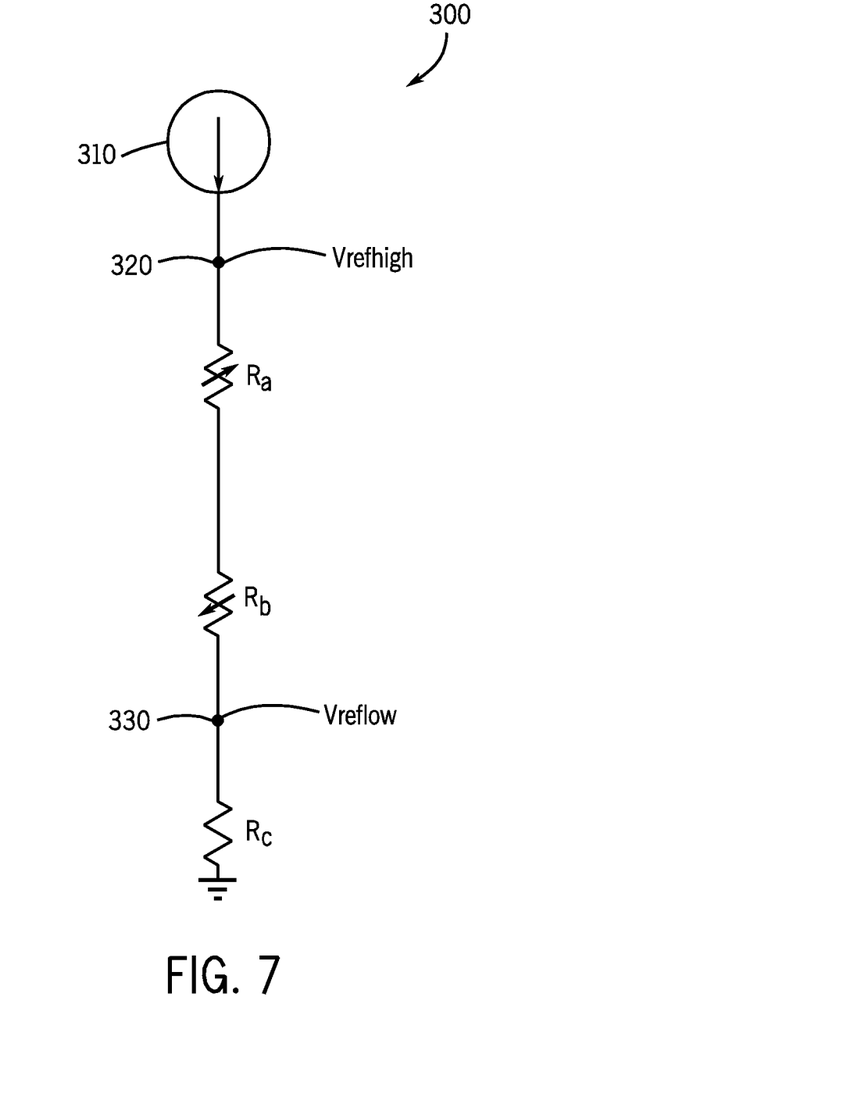
FIG. 7 is a schematic diagram of a portion of a voltage generation circuit in accordance with an embodiment.

Referring now to FIG. 7, shown is a schematic diagram of a portion of a voltage generation circuit in accordance with an embodiment. As shown in FIG. 7, voltage generation circuit 300 includes a current source 310 coupled to a resistor ladder including a first resistor $R_a$, a second resistor $R_b$ and a third resistor $R_c$. In an embodiment, first resistor $R_a$ may be a negative temperature compensation controllable resistor, while second resistor $R_b$ may be a positive temperature compensation controllable resistor, and third resistor $R_c$ may be an uncompensated fixed resistor. In an embodiment, the control of these resistors may be by way of appropriate switches. As seen, the first reference voltage may be obtained from a first node 320 coupled between current source 310 and $R_a$. In an embodiment, these controllable resistors may be controlled by configuration information stored in a temperature compensation table. This table may be generated during initial silicon characterization of a manufacturing process and then inserted into firmware of the production manufacturing such that the need for individual characterization and trimming can be avoided. Note there are many possible scenarios for trimming with various accuracies. As one example, the ratio of negative temperature compensation and positive temperature compensation contribution may be selected based on characterization, and the overall resistance is trimmed at a single point for each part to obtain the desired frequency. Or each wafer lot may be characterized, with the best value stored in the device. By using two opposing temperature compensation resistors a temperature compensation table can be avoided by having a setting for a single negative and positive temperature compensation.

In other implementations, no calibration is performed and instead the clock signal generated can be provided to a phase locked loop (PLL) or other clock controller to enable a frequency adjustment to be performed in obtaining any desired clock frequency.

A relaxation oscillator as described herein can be used in many different types of applications. As an example, the oscillator can be used to generate a relatively stable clock frequency signal that is provided to one or more phase locked loops or other clock controllers to generate additional clocks for a device. As one such example, the oscillator output clock signal can be of an arbitrary frequency to avoid the need for performing fine frequency control. Instead, the arbitrary frequency clock signal generated by the oscillator can be provided to one or more PLLs that in turn generate desired clock frequencies for a device.

Figure 8:
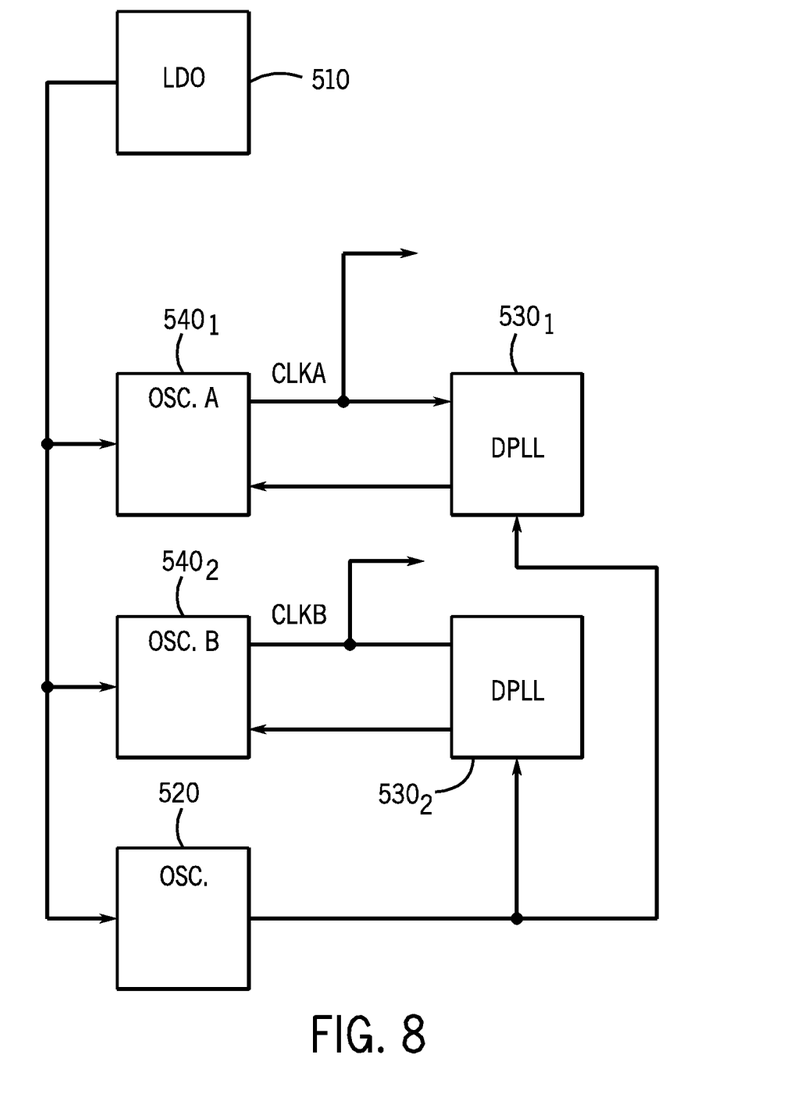
FIG. 8 is a block diagram of a portion of a device in accordance with an embodiment.

Referring now to FIG. 8, shown is a block diagram of a portion of a device in accordance with an embodiment. As shown in FIG. 8, a circuit 500 may be used to generate a plurality of clock signals for use in a device such as a microcontroller unit (MCU) or other logic circuitry. Circuit 500 receives a supply voltage via a low drop out (LDO) voltage regulator 510 that provides a regulated voltage to various components of the circuit. As seen, an oscillator 520 may be a relaxation oscillator in accordance with an embodiment in which a clock signal is generated with relatively stable frequency performance across a wide range of temperature, supply and process conditions. As an example, this clock signal may be generated with a temperature stable frequency of approximately 1 megahertz (MHz). However, the actual frequency generated can be a value approximately at this frequency, as the output clock signal CLK is in turn provided to multiple digital phase lock loops (DPLLs) $530_1$ and $530_2$ that in turn control high frequency oscillators $540_1$ and $540_2$ that, under control of the associated DPLL can generate precise frequencies of clock signals CLKA and CLKB. These clock signals can be used for various purposes. For example, one such clock signal (e.g., CLKA) may be used as a system clock signal for control of the MCU or other device while in turn the other clock signal (e.g., CLKB) can be used for purposes of a communication interface such as a CAN bus. Note that in some embodiments during manufacture, a value of the error in the period of the clock signal generated by oscillator 520 can be stored in a non-volatile storage and then can be used by the DPLLs to generate the control signal to generate the desired frequencies in oscillators $540_1$ and $540_2$. Of course additional clock signals may be generated, and the clock signals shown may be used for other purposes in addition for use as a system clock and communication interface reference clock signal.

Figure 9:
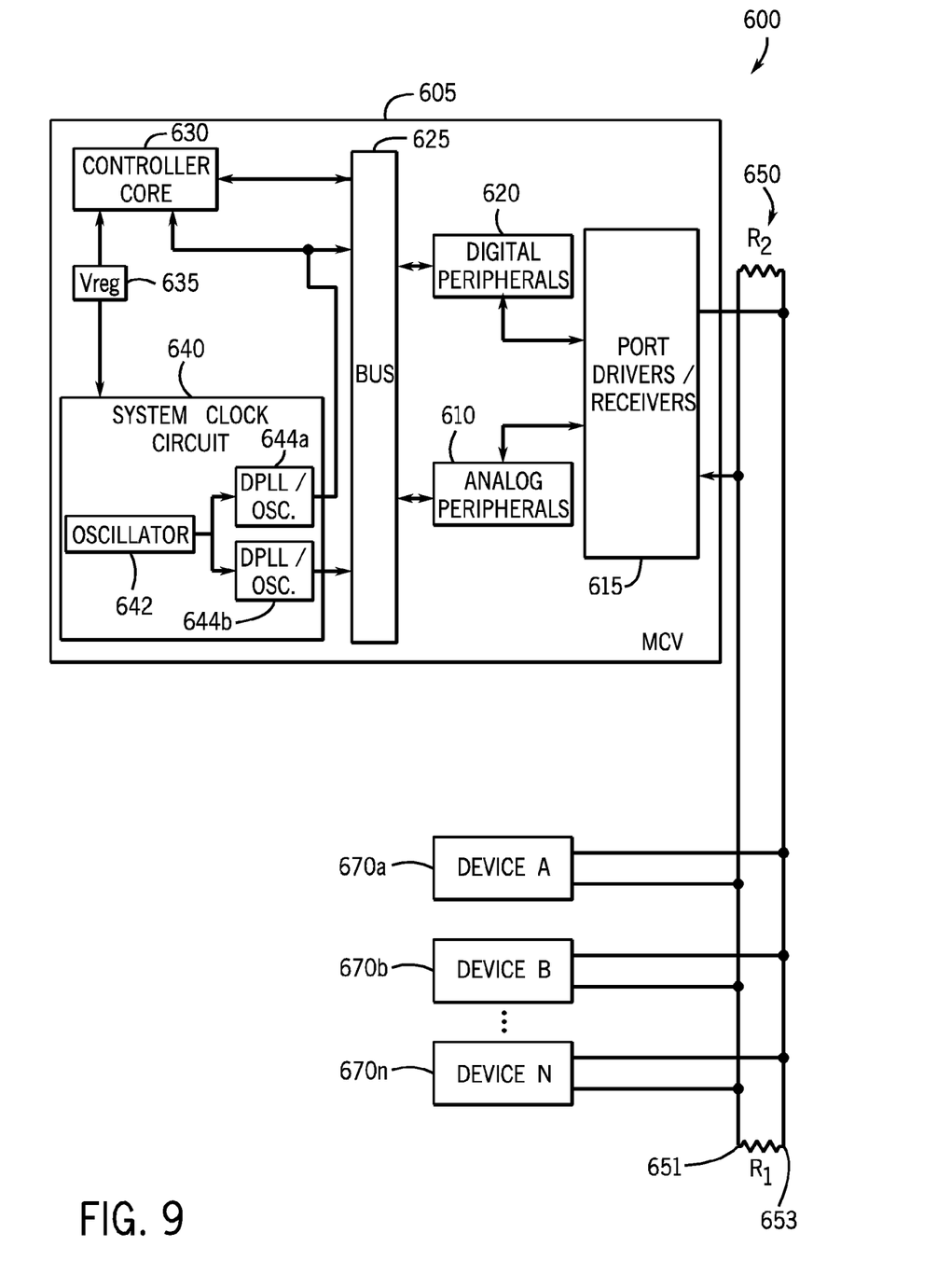
FIG. 9 is a block diagram of a system in accordance with an embodiment.

Referring now to FIG. 9, shown is a block diagram of a system in accordance with an embodiment. As shown in FIG. 9, system 600 may be a multi-device communication system such as for interconnection of various electronic control modules within an automobile. Of course understand that in another embodiment a system can be a different type of computing device having interconnected components. As seen in FIG. 9, system 600 includes a MCU 605 in turn coupled to a plurality of devices $670_a$-$670_n$ via a controller area network (CAN) bus 650. As seen, this CAN bus includes a high line 651 and a low line 653 interconnected by termination resistors R1 and R2. Of course understand that while the embodiment shown is for a CAN bus, interconnection of devices can be by way of another type of bus or interconnect.

With reference to MCU 605 a controller core 630 is present which in an embodiment can be an 8051-based core. As seen, it receives a regulated voltage from a voltage regulator 635. Furthermore, controller core 630 receives a system clock from a system clock circuit 640. Clock circuit 640 includes an oscillator 642 as described herein such as a relaxation oscillator having an arrangement to remove delay associated with comparator and logic elements of the oscillator. As seen, the clock signal output by oscillator 642 in turn drives two DPLL/oscillators $644_a$ and $644_b$, each of which may generate a particular frequency. Specifically, oscillator $644_a$ generates a system clock signal while oscillator 644 generates a reference clock signal that can be used for purposes of communication on CAN bus 650.

As further seen in FIG. 9, MCU 605 includes a bus 625 to interconnect the various components, including a digital peripherals section 620 and an analog peripheral section 610. In turn, these sections couple via a set of port drivers/receivers 615 to bus 650. Although shown at this high level in the embodiment of FIG. 9, understand that various alternatives are possible.

While the present disclosure is with respect to a limited number of embodiments, those skilled in the art will appreciate numerous modifications and variations therefrom. It is intended that the appended claims cover all such modifications and variations as fall within the true spirit and scope.

What is claimed is:
1. An apparatus comprising:
a first capacitor to pre-charge to a first voltage exceeding a first reference voltage by a first delay compensation voltage during a first portion of a clock period and thereafter to charge to a second voltage exceeding a second reference voltage by a second delay compensation voltage during a second portion of the clock period;
a second capacitor to charge to the second voltage during the first portion of the clock period and to pre-charge to the first voltage during the second portion of the clock period;
a first comparator coupled to the first capacitor to compare a first voltage of the first capacitor to the first reference voltage during the first clock period portion and to compare the first capacitor voltage to the second reference voltage during the second clock period portion and to provide a first comparison output to a timing logic circuit; and
a second comparator coupled to the second capacitor to compare a voltage of the second capacitor to the second reference voltage during the first clock period portion and to compare the second capacitor voltage to the first reference voltage during the second clock period portion and to provide a second comparison output to the timing logic circuit;
wherein the timing logic circuit receives the first comparison output and the second comparison output and generates a clock signal based thereon.

2. The apparatus of claim 1, further comprising a reference voltage generation circuit to generate the first reference voltage and the second reference voltage, the reference voltage generation circuit including a first switch to couple the first reference voltage to a comparison input of the first comparator during the first portion of the clock period, and to couple the second reference voltage to the comparison input of the first comparator during the second portion of the clock period.

3. The apparatus of claim 2, wherein the reference voltage generation circuit comprises:
a first branch circuit to generate the first reference voltage, the first branch circuit including a first resistor; and
a second branch circuit to generate the second reference voltage, the second branch circuit including a second resistor, wherein the second resistor comprises a temperature compensation trimmed resistor.

4. The apparatus of claim 1, wherein the timing logic circuit includes a latch to receive the first comparison output and the second comparison output and to generate the clock signal therefrom.

5. The apparatus of claim 1, wherein the timing logic circuit includes a control logic circuit to generate first control signals to control a first plurality of switches of a first switched capacitor stage including the first capacitor, and to generate second control signals to control a second plurality of switches of a second switched capacitor stage including the second capacitor.

6. The apparatus of claim 5, wherein the first switched capacitor stage comprises:
a first switch coupled between a first current source and a reference voltage node;
a second switch coupled between the first current source and the first capacitor; and
a third switch coupled in parallel with the first capacitor between the first current source and the reference voltage node.

7. The apparatus of claim 6, wherein the first switched capacitor stage further comprises a first capacitor voltage node coupled to the first capacitor and the third switch, and to provide the first capacitor voltage to the first comparator.

8. The apparatus of claim 5, wherein the control logic circuit comprises a state machine to control the first plurality of switches to enable the pre-charge of the first capacitor, the charge of the first capacitor, and a discharge of the first capacitor.

9. The apparatus of claim 1, wherein the first capacitor is to control a timekeeping operation for the clock signal during the second clock period portion, and the second capacitor is to control the timekeeping operation for the clock signal during the first portion of the clock period.

10. A system comprising:
an oscillator to generate a first clock signal, the oscillator comprising:
a first switched capacitor stage circuit to control a timekeeping operation for the first clock signal during a second portion of a cycle of the first clock signal, the first switched capacitor stage circuit including a first capacitor;
a second switched capacitor stage circuit to control the timekeeping operation for the first clock signal during a first portion of the cycle, the second switched capacitor stage circuit including a second capacitor; and
a control logic circuit to generate first control signals to control the first switched capacitor stage circuit to cause the first capacitor to pre-charge to a first voltage greater than a first reference voltage, to charge to a second voltage greater than a second reference voltage, and to thereafter discharge, the control logic circuit further to generate second control signals to control the second switched capacitor stage circuit to charge the second capacitor to the second voltage, to discharge, and to thereafter pre-charge to the first voltage, the control logic circuit to generate the first clock signal based on an output of the first switched capacitor stage circuit and an output of the second switched capacitor stage circuit; and
a microcontroller coupled to the oscillator to receive the first clock signal.

11. The system of claim 10, further a first phase locked loop circuit coupled to receive the first clock signal and to control a second oscillator to generate a second clock signal, wherein the second clock signal is a system clock signal for the microcontroller.

12. The system of claim 10, further comprising a second phase locked loop circuit to receive the first clock signal and to control a second oscillator to generate a third clock signal, wherein the third clock signal is a reference clock signal for an interconnect.

13. The system of claim 12, wherein the microcontroller is to communicate with at least one other device via the interconnect clocked by the third clock signal.

14. The system of claim 10, wherein a difference between the first voltage and the first reference voltage corresponds to a delay compensation voltage, the delay compensation voltage to compensate for delay associated with the control logic circuit.

15. The system of claim 10, wherein the control logic circuit comprises a state machine to control the pre-charge of the first capacitor, the charge of the first capacitor, and the discharge of the first capacitor.

16. The system of claim 10, further comprising a reference voltage generation circuit to generate the first reference voltage and the second reference voltage, the reference voltage generation circuit to couple the first reference voltage to a first input of a first comparator during the first portion of the cycle and to couple the second reference voltage to the first input of the first comparator during the second portion of the cycle.

17. A method comprising:
during a first portion of a cycle of a clock signal generated by an oscillator, pre-charging a first capacitor of a first switched capacitor stage until a first comparator determines that a first node voltage of the first switched capacitor stage is greater than a first reference voltage at a first reference voltage node;
applying a second reference voltage to the first reference voltage node; and
responsive to a first edge of the clock signal, charging the first capacitor until the first comparator determines that the first node voltage is greater than the second reference voltage at the first reference voltage node, wherein the first capacitor performs a timekeeping operation for a second portion of the clock signal cycle.

18. The method of claim 17, further comprising discharging the first capacitor responsive to a second edge of the clock signal.

19. The method of claim 18, further comprising applying the first reference voltage to the first reference voltage node.

20. The method of claim 17, further comprising controlling a second capacitor of a second switched capacitor stage out of phase with the first capacitor such that the second capacitor performs a timekeeping operation for the first portion of the clock cycle.

* * * * *